US007236228B2

(12) United States Patent
Miyajima

(10) Patent No.: US 7,236,228 B2
(45) Date of Patent: Jun. 26, 2007

(54) EXPOSURE APPARATUS

(75) Inventor: Yoshikazu Miyajima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 176 days.

(21) Appl. No.: 10/880,525

(22) Filed: Jul. 1, 2004

(65) Prior Publication Data

US 2005/0007575 A1 Jan. 13, 2005

(30) Foreign Application Priority Data

Jul. 8, 2003 (JP) .............................. 2003-193632

(51) Int. Cl.
G03B 27/52 (2006.01)
G03B 27/58 (2006.01)

(52) U.S. Cl. ...................... 355/30; 355/53; 355/72; 355/75; 378/34

(58) Field of Classification Search ................. 355/30, 355/53, 72, 75; 378/34, 35
See application file for complete search history.

(56) References Cited

U.S. PATENT DOCUMENTS

| 5,623,853 | A | * | 4/1997 | Novak et al. ............. 74/490.09 |
| 6,057,511 | A |   | 5/2000 | Ikeda et al. ............. 170/110 R |
| 6,222,614 | B1 | * | 4/2001 | Ohtomo .................... 355/53 |
| 6,262,794 | B1 |   | 7/2001 | Miyajima .................... 355/53 |
| 6,266,133 | B1 |   | 7/2001 | Miyajima et al. ............. 355/72 |
| 6,320,649 | B1 |   | 11/2001 | Miyajima et al. ............. 355/72 |
| 6,583,859 | B2 |   | 6/2003 | Miyajima et al. ............. 355/72 |
| 6,915,179 | B2 |   | 7/2005 | Emoto ........................ 700/121 |

| 2002/0081528 | A1 | 6/2002 | Miyajima et al. ............ 430/302 |
| 2003/0071982 | A1 | 4/2003 | Miyajima et al. ............ 355/72 |

FOREIGN PATENT DOCUMENTS

| EP | 0 899 749 A2 | 3/1999 |
| EP | 1 018 669 A2 | 7/2000 |
| JP | 3-43914 | 2/1991 |
| JP | 7-96489 | 4/1995 |
| JP | 8-232296 | 9/1996 |
| JP | 11-30294 | 2/1999 |
| JP | 11-69588 | 3/1999 |
| JP | 2001-297967 | 10/2001 |
| JP | 2002-27649 | 1/2002 |
| JP | 2002-198284 | 7/2002 |

(Continued)

OTHER PUBLICATIONS

Japanese Office Action dated Mar. 6, 2006, Issued in corresponding Japanese patent application No. 2003-193632.

(Continued)

Primary Examiner—D. Rutledge
(74) Attorney, Agent, or Firm—Fitzpatrick, Cella, Harper & Scinto

(57) ABSTRACT

An exposure apparatus includes a projection device for projecting a pattern drawn on a surface of a master, a stage apparatus which moves at least a substrate of the master and a substrate relative to the projection device, and an exposure device for repeatedly exposing the substrate to the pattern of the master. A plurality of pipes connected to movable units of the stage apparatus are joined to each other at partial outer surfaces of the pipes and constitute an integrated pipe array. Electrical cables or signal line cables connected to the movable unit pass through hollow portions of some of the pipes serving as the integrated pipe array.

11 Claims, 12 Drawing Sheets

FOREIGN PATENT DOCUMENTS

| | | | |
|---|---|---|---|
| JP | 2003-37153 | | 2/2003 |
| JP | 2003-168326 | | 6/2003 |
| WO | WO 96/34051 | * | 10/1996 |

OTHER PUBLICATIONS

European Search Report dated Sep. 15, 2006, issued in corresponding European patent application No. EP 04 25 4049, forwarded in a Communication dated Oct. 12, 2006.

Hungarter, E. "Flexible Cable," IBM Technical Disclosure Bulletin, vol. 22, No. 12, May 1, 1980. p. 5303.

Salvadore, J.M. et al. "Integral Tubing and Conductor Cable, " IBM Technical Disclosure Bulletin, vol. 21, No. 6, Nov. 1, 1978. p. 2217.

* cited by examiner

EXPOSURE APPARATUS

CLAIM OF PRIORITY

The present application claims priority under 35 U.S.C. § 119 from Japanese Patent Application No. 2003-193632, entitled "An Exposure Apparatus" and filed on Jul. 8, 2003, the entire contents of which are hereby incorporated by reference herein.

FIELD OF THE INVENTION

The present invention relates to an exposure apparatus used in a semiconductor manufacturing process, such as a projection exposure apparatus, which projects and transfers a reticle pattern onto a silicon wafer and, more particularly, to a stage apparatus, which moves a reticle and a silicon wafer by a reticle stage and a wafer stage that sequentially move the reticle and wafer, respectively, with respect to a projection exposure system when a reticle pattern is projected/exposed onto a wafer.

BACKGROUND OF THE INVENTION

FIGS. 1A and 1B are views for explaining the prior art of the present invention and show X and Y piping assemblies on a wafer stage and cross sections of the X piping assembly, respectively.

As shown in FIGS. 1A and 1B, a pressure air system comprises pressure air pipes 120a to 120e, which supply pressure air. A vacuum system comprises vacuum pipes 120f and 120g, which supply chuck vacuum air for a wafer 109 and chuck vacuum air for a wafer chuck 108. A coolant system comprises coolant pipes 120h and 120i, which supply/recover a coolant. An electrical system comprises electrical cables 120j and 120k, which supply signals and driving currents among an illuminance sensor 112 on a fine adjustment stage 107, a photosensor within a stage reference mark 113, and driving units. A Y piping assembly 121 has almost the same arrangement as that of an X piping assembly and aims at movably connecting pipes in the Y direction. A pipe coupling wire 122 binds the piping assemblies of the respective systems to connect the pipes 120a to 120g of the pressure air and vacuum systems, the coolant pipes 120h and 120i of the coolant system, and the electrical cables 120j and 120k of the electrical system in almost a belt-like manner. A piping assembly of this type and an arrangement based on the same concept are disclosed in Japanese Patent Laid-Open No. 11-030294.

However, in the above-mentioned prior art example, the pipes of the systems are separately connected to a stage movable unit. When the stage movable unit moves, the pipes of the systems may rub against each other, may warp at an indefinite position, or may warp at the pipe coupling portion. Disturbance from the connecting portion of each piping system may decrease the control accuracy of a stage.

When a stage apparatus is used in a low-humidity environment, such as a nitrogen-purged atmosphere or a vacuum, movement of the piping system connecting portions tends to generate static electricity to charge the surfaces of the respective piping members. An electrostatic spark may occur at an indefinite position between the pipes or between components on the stage apparatus to damage the pipes, the electrical cables, and the components of the stage.

The present invention has been made in consideration of the conventional drawbacks, and to provide an exposure apparatus capable of minimizing disturbance by a piping system connecting portion, dust, and electrostatic buildup on the surfaces of piping members.

SUMMARY OF THE INVENTION

According to the present invention, there is provided an exposure apparatus comprising projection means for projecting a pattern drawn on a surface of a master, moving means for causing a stage apparatus to move at least a substrate of the master and substrate relative to the projection means, and exposure means for repeatedly exposing the substrate to the pattern of the master, wherein a plurality of pipes, which are connected to movable units of the stage apparatus and have different inner and outer diameters, are joined to each other at partial outer surface of the pipes and constitute an integrated piping array.

When the apparatus is used in a low humidity environment in a vacuum, it is arranged in the following manner to prevent movement of each piping system connecting portion from generating static electricity on the surfaces of piping members. More specifically, a conductive material is added to a piping resin, or a conductive film is sputtered on the surface of the pipes. Alternatively, different types of tubes are used for the inner and outer surfaces of the pipes, and the outer surfaces are made conductive, thereby forming a layer structure. With this arrangement, any potential charged on the surface of each tube is grounded and discharged to, e.g., chassis ground.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

First Embodiment

Figure 1A:
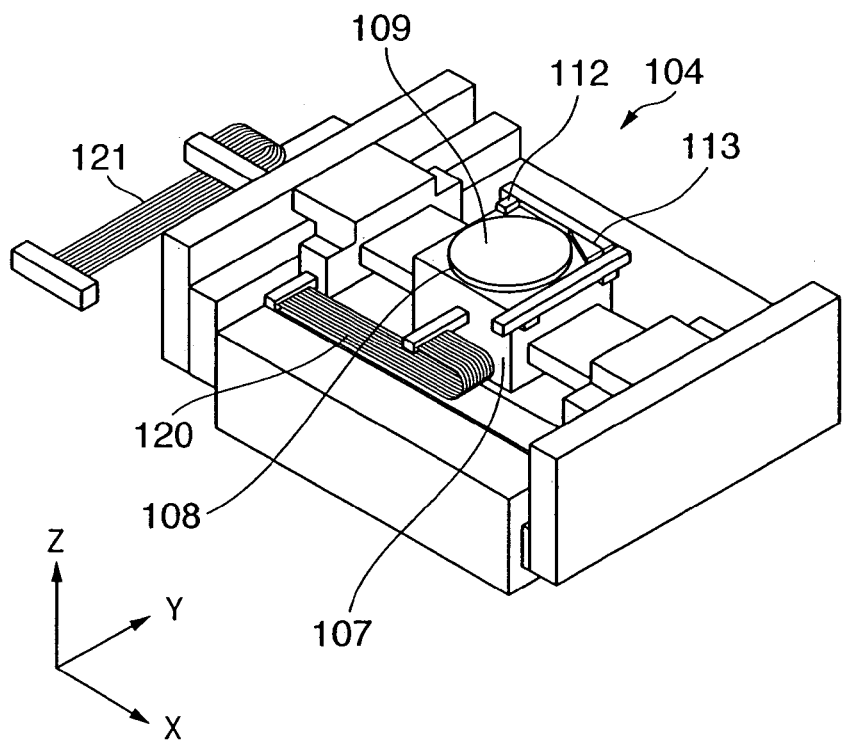
FIGS. 1A and 1B are views showing a prior art stage and cross sections of a piping assembly, respectively.
Figure 1B:
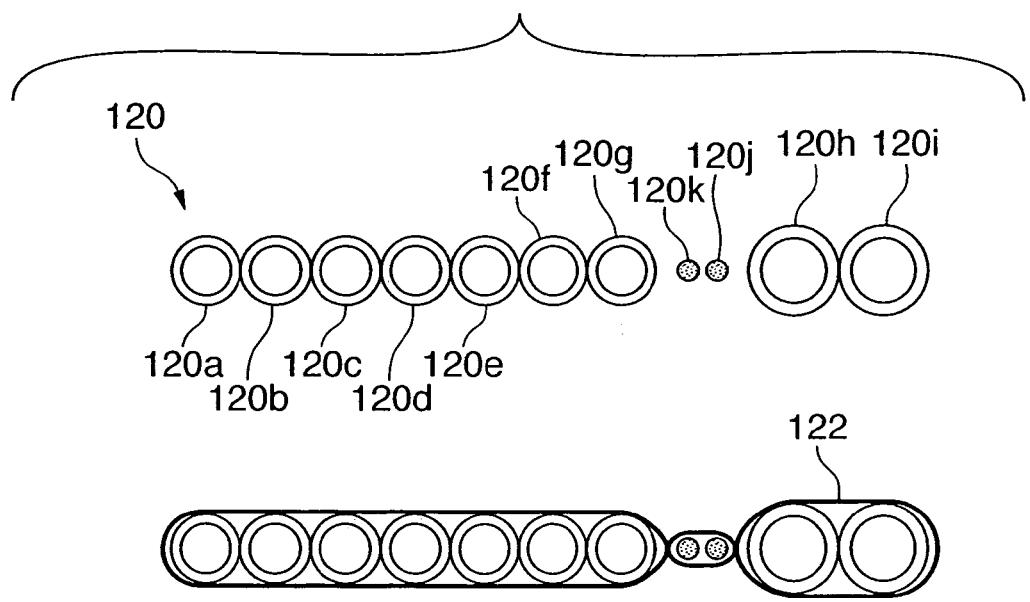
Figure 2:
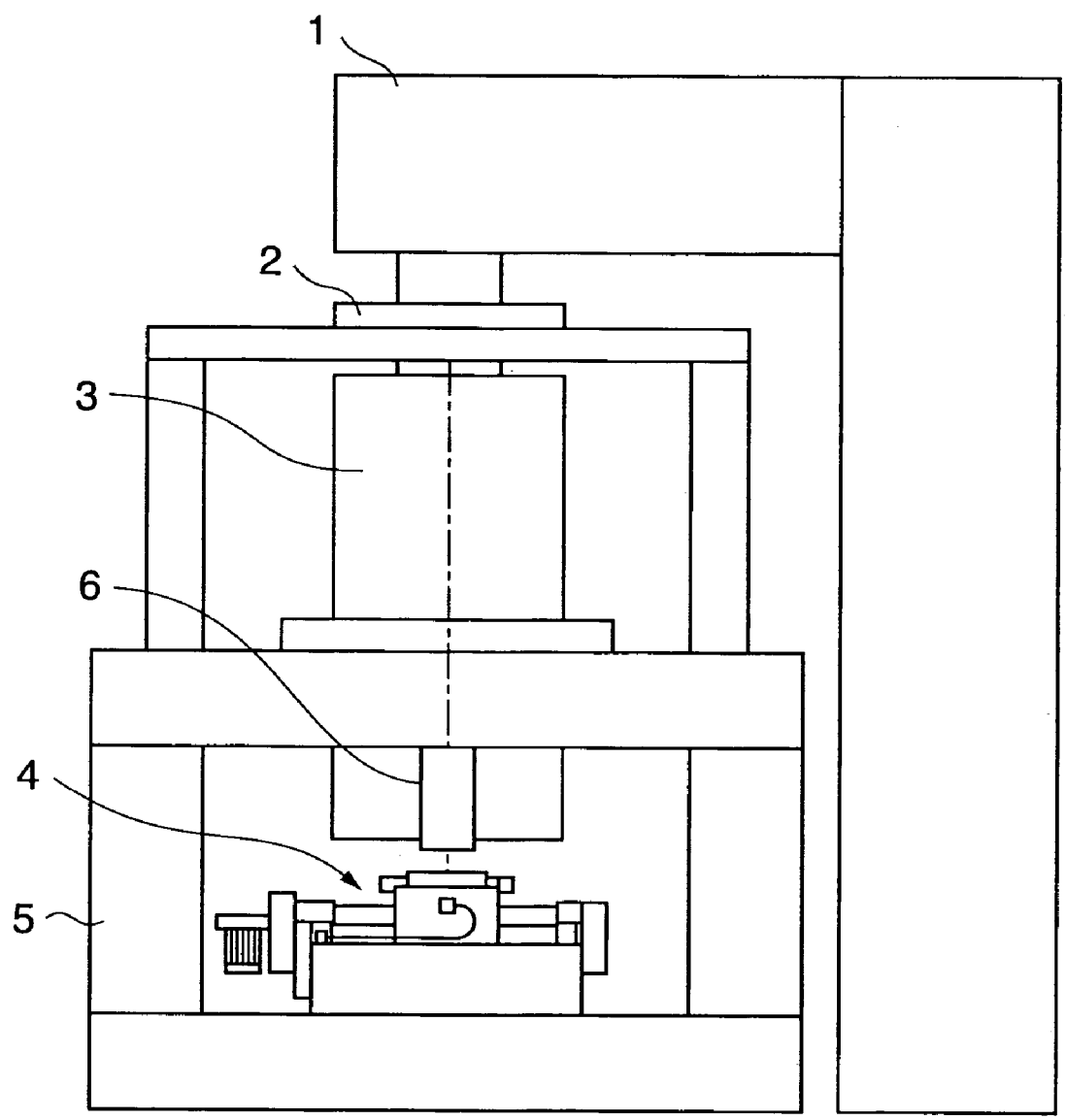
FIG. 2 is a view showing the entirety of an exposure apparatus according to the present invention.
Figure 3:
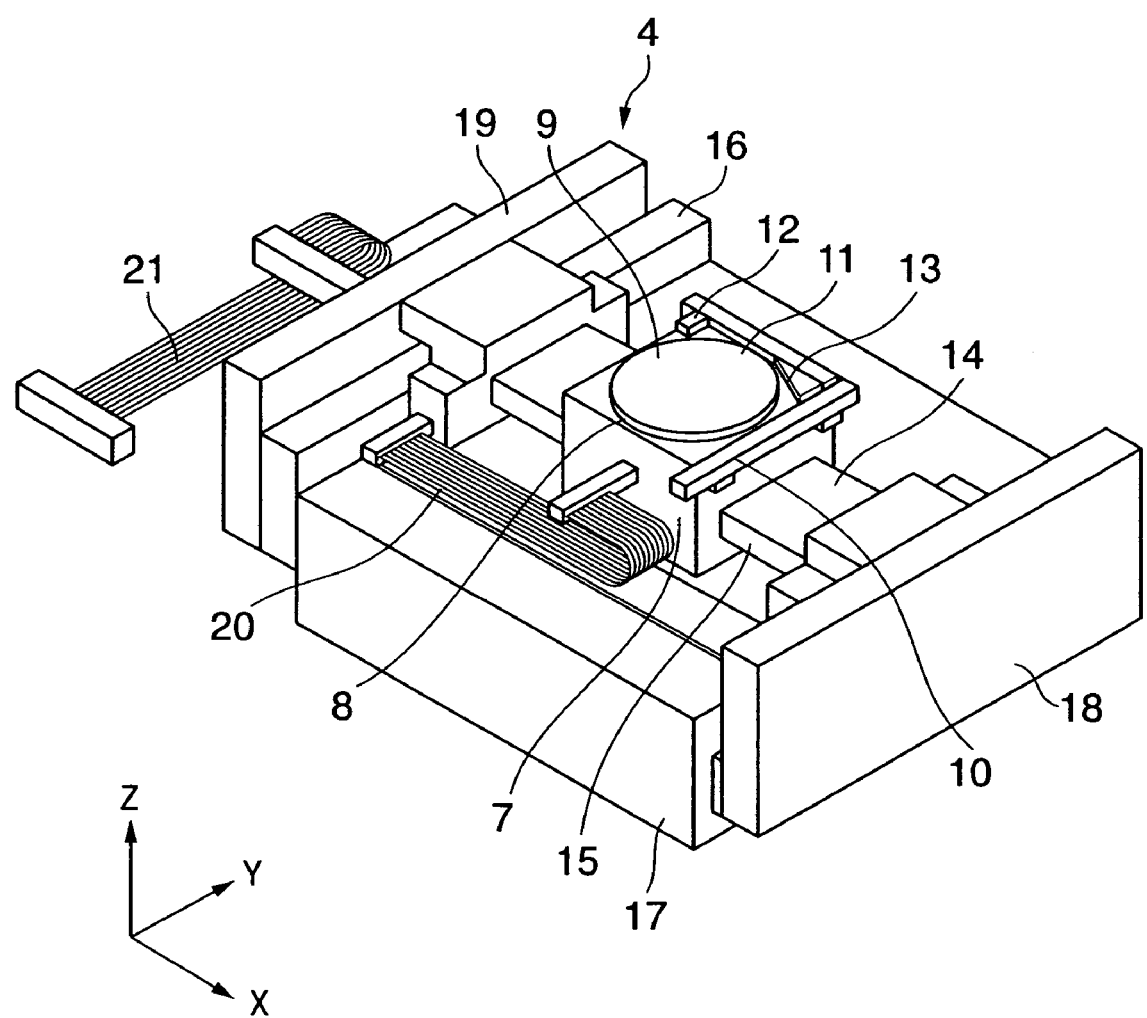
FIG. 3 is a perspective view of a stage apparatus according to the present invention.

FIGS. 2 and 3 are views showing an exposure apparatus common to each embodiment and a wafer stage which constitutes a part of the exposure apparatus, respectively.

In FIG. 2, reference numeral 1 denotes an illumination system unit, which comprises an exposure light source and has a function of shaping exposure light emitted from the exposure light source and irradiating a reticle with the exposure light. Reference numeral 2 denotes a reticle stage, which has the reticle serving as an exposure pattern master on it and has a function of performing a reticle scan operation for a wafer at a predetermined reduction exposure magnification ratio to the wafer. Reference numeral 3 denotes a reduction projection lens, which reduces and projects a master pattern onto the wafer (substrate). Reference numeral 4 denotes a wafer stage (4), which has a function of sequentially continuously moving the substrate (wafer) for every exposure process.

Reference numeral 5 denotes an exposure apparatus main body (5), which supports the reticle stage 2, reduction projection lens 3, and wafer stage 4. Reference numeral 6 denotes an alignment scope, which measures an alignment mark on the wafer and an alignment reference mark on the stage and performs measurement in alignment within the wafer and alignment between the reticle and the wafer.

FIG. 3 is a view showing in detail the wafer stage 4 in FIG. 2.

In FIG. 3, reference numeral 7 denotes a fine adjustment stage, which finely adjusts the wafer on the stage in a direction of an optical axis of a reduction exposure system, a tilt direction, and a rotational direction about the optical axis. Reference numeral 8 denotes a wafer chuck, which supports and fixes the wafer to the fine adjustment stage 7. Reference numeral 9 denotes a wafer. In the wafer 9, the surface of a single-crystal Si substrate is coated with a resist to project and transfer a reticle pattern drawn on a reticle substrate onto the wafer 9 through the reduction exposure system.

Reference numeral 10 denotes an X bar mirror, which serves as a target when a laser interferometer measures the X-direction position of the fine adjustment stage 7. Reference numeral 11 denotes a Y bar mirror, which serves as a target in measuring the Y-direction position, similar to the X bar mirror. Reference numeral 12 denotes an illuminance sensor arranged on the upper surface of the fine adjustment stage 7. The illuminance sensor 12 performs calibration measurement for the illuminance of exposure light before exposure and uses the obtained illuminance to correct light exposure. Reference numeral 13 denotes a stage reference mark arranged on the upper surface of the fine adjustment stage 7. A target for stage alignment measurement is formed in it.

Reference numeral 14 denotes an X linear motor, which moves and drives the fine adjustment stage 7 in the X direction. Reference numeral 15 denotes an X guide for guiding X-axis movement of the fine adjustment stage 7. Reference numeral 16 denotes a Y guide for moving and guiding the X guide 15 and fine adjustment stage 7 in the Y direction. Reference numeral 17 denotes a stage surface plate, which two-dimensionally guides the fine adjustment stage 7. Reference numerals 18 and 19 denote Y linear motors for moving and driving the fine adjustment stage 7 in the Y direction.

Reference numeral 20 denotes an X piping assembly. The X piping assembly 20 aims at movably connecting in the X direction a plurality of pipes, which supply pressure dry air or vacuum air to an air bearing system (not shown) or the wafer chuck 8 mounted on the fine adjustment stage 7, pipes which supply and recover a liquid cooling medium for cooling the driving units inside the fine adjustment stage 7, and electrical cables, which transmit signals and feed currents between sensor systems and the driving units mounted on the fine adjustment stage 7.

Figure 4A:
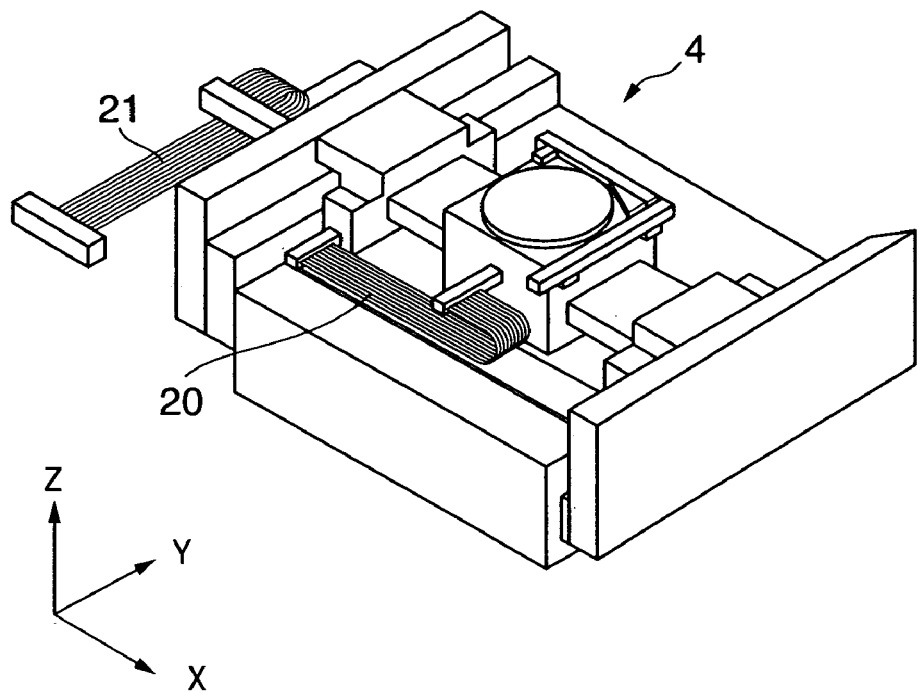
FIGS. 4A and 4B are views showing a wafer stage 4 and a cross section of a stage piping assembly, respectively, according to the first embodiment.
Figure 4B:
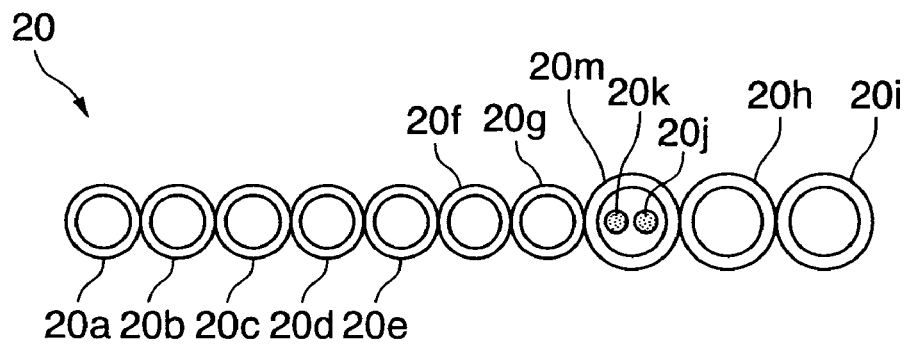

FIGS. 4A and 4B are views showing piping assemblies according to the first embodiment. FIG. 4A shows the layout relationship between the wafer stage 4, and the X piping assembly 20 and a Y piping assembly 21. FIG. 4B is a view showing the cross section of the X piping assembly according to the first embodiment.

As shown in FIGS. 4A and 4B, a pressure air system has pressure air pipes 20a to 20e, which supply pressure air.

A vacuum system has vacuum pipes 20f and 20g, which draw chuck vacuum air of the wafer 9 and chuck vacuum air of the wafer chuck 8.

A coolant system has coolant pipes 20h and 20i, which supply and recover a coolant.

An electrical system supplies signals and driving currents between the illuminance sensor 12 on the fine adjustment stage 7, a photosensor within the stage reference mark 13, and the driving units through electrical cables 20j and 20k extending inside an electrical-cable-incorporated pipe 20m.

The Y piping assembly 21 has almost the same arrangement as that of the X piping assembly and aims at movably connecting the pipes in the Y direction. The arrangement of the Y piping assembly 21 is similar to that of the X piping assembly 20.

As shown in FIGS. 4A and 4B, the pressure air pipes 20a to 20e serving as the pressure air system, coolant pipes 20h and 20i serving as the cooling system, and electrical-cable-incorporated pipe 20m, are connected to each other at their outer surfaces and are integrated as a belt-like pipe array. A polyurethane tube, or the like, is employed as a piping material.

The electrical-cable-incorporated pipe 20m has almost the same diameter as that of the coolant pipes 20h and 20i. This prevents the piping assembly from readily breaking at the electrical-cable-incorporated pipe. Direct integration like the array shown in the prior art can enjoy the advantages of integration. However, the electrical cables described in the prior art are much thinner than any other pipe and, thus, tend to break.

The diameter of the electrical-cable-incorporated pipe 20m may be made equal to that of the pressure air pipes or may be set between the pressure air pipes and the coolant pipes.

As described above, according to the first embodiment, the pressure air system, cooling system, and electrical-cable-incorporated pipe are integrated as a belt-like pipe array. This arrangement prevents any rub of the pipes of the respective systems against each other, any warp of the pipes at an indefinite position, and any warp of the pipes at a pipe coupling portion, when each stage movable unit moves. This makes it possible to reduce disturbance to the stage movable unit and dust from the pipes and to increase the stage control accuracy and alignment precision.

Second Embodiment

Figure 5:
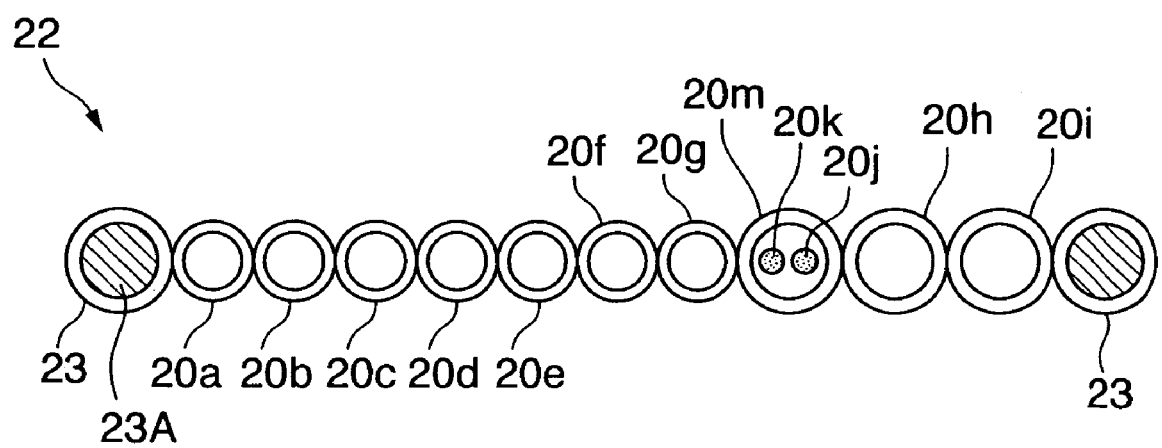
FIG. 5 is a view showing the cross section of a stage piping assembly according to the second embodiment.

FIG. 5 is a view showing the arrangement of a piping assembly according to the second embodiment.

The piping assembly according to the second embodiment is characterized in that it is formed by joining vibration damping pipes 23 (gel with a large internal loss and a liquid area sealed inside the pipes) at both ends of a piping assembly according to the first embodiment. Each vibration damping pipe 23 can be filled with, e.g., a gelatinous material 23A with a large internal loss, a liquid, a polymeric material, and the like.

The vibration damping pipes at both ends of the piping assembly comprising pipes make it possible to damp vibrations of the pipes themselves, which move as a stage moves. The second embodiment, which has the arrangement of the first embodiment as well, prevents any rub of the pipes of respective systems against each other, any warp of the pipes at an indefinite position, and any warp of the pipes at a pipe coupling portion, when each stage movable unit moves. This makes it possible to reduce disturbance to the stage movable unit and dust from the pipes and to increase the stage control accuracy and alignment precision.

Third Embodiment

Figure 6:
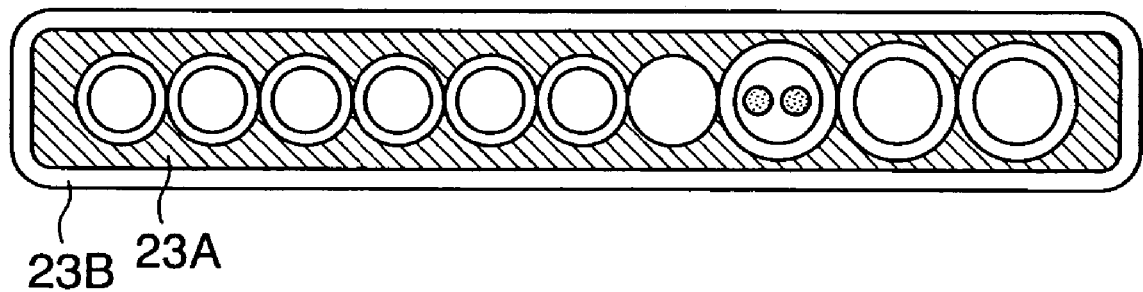
FIG. 6 is a view showing the cross section of a stage piping assembly according to the third embodiment.

FIG. 6 is a view showing the arrangement of a piping assembly according to the third embodiment.

The piping assembly according to the third embodiment is characterized in that a vibration damping pipe 23B (a gelatinous material 23A with a large internal loss, a liquid, a polymeric material, and the like, are sealed inside the pipe) is provided for a piping assembly according to the first embodiment so as to enclose the outer surfaces of the pipes. The vibration damping pipe 23B is filled with, e.g., the gelatinous material 23A with a large internal loss, a liquid, a polymericl material, and the like, as described in the second embodiment.

The vibration damping pipe 23B so arranged as to enclose the outer surfaces of the pipes makes it possible to damp vibrations of the pipes themselves, which move as a stage moves.

The third embodiment, which has the arrangement of the first embodiment as well, prevents any rub of the pipes of respective systems against each other, any warp of the pipes at an indefinite position, and any warp of the pipes at an indefinite position, and any warp of the pipes at a pipe coupling portion, when each stage movable unit moves. This makes it possible to reduce disturbance to the stage movable unit and dust from the pipes and to increase the stage control accuracy and alignment precision.

Fourth Embodiment

Figure 7:
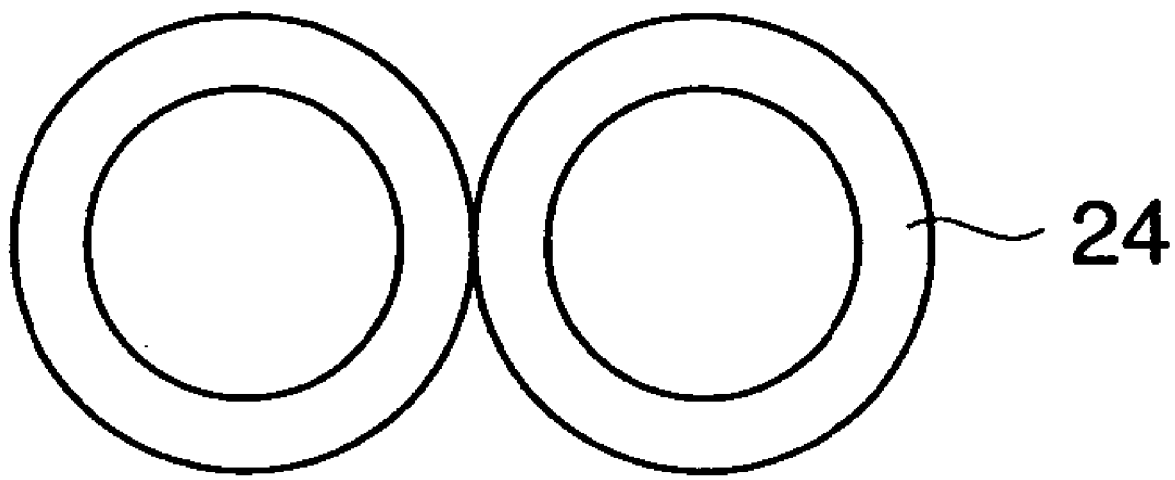
FIG. 7 is a view showing the cross section of a stage piping assembly according to the fourth embodiment.

FIG. 7 is a view showing the arrangement of a piping assembly according to the fourth embodiment.

The above-mentioned embodiments use a polyurethane tube as a piping material. The fourth embodiment is characterized by using thermoplastic fluororesin tubes 24 with lower water absorption.

With this arrangement, a piping assembly with a smaller water loss can be implemented in a stage apparatus in a vacuum environment or a stage apparatus in an environment purged of air (oxygen) with nitrogen, helium, or the like.

Fifth Embodiment

Figure 8:
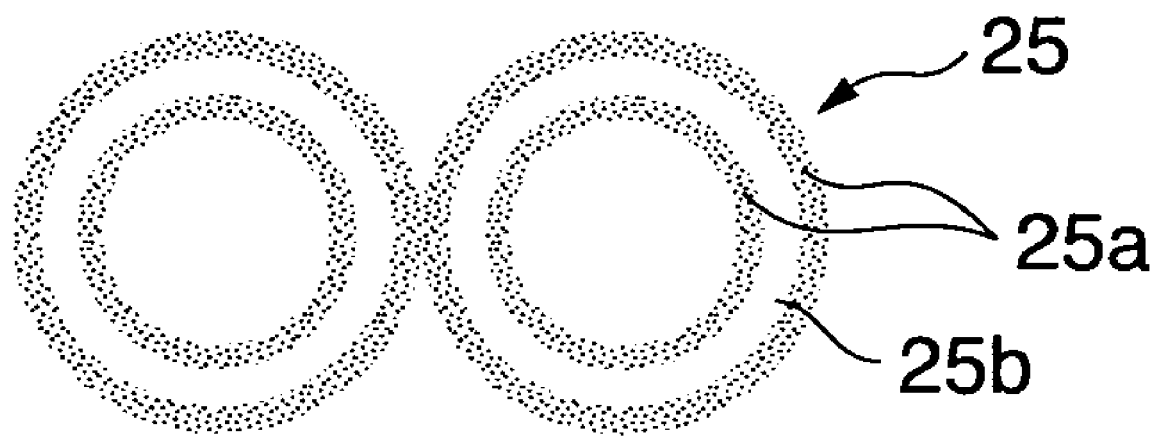
FIG. 8 is a view showing the cross section of a stage piping assembly according to the fifth embodiment.

FIG. 8 is a view showing the arrangement of a piping assembly according to the fifth embodiment.

The fourth embodiment uses a thermoplastic fluororesin tube as a piping material. The fifth embodiment is characterized by using thermoplastic fluororesin tubes 25a with lower water absorption as the inner and outer surfaces of each tube and using a polyurethane tube 25b as the intermediate layer of the tube.

Use of multilayered polyurethane/thermoplastic fluororesin tubes 25, including the thermoplastic fluororesin tube 25a and polyurethance tube 25b, makes it possible to implement a piping assembly with a smaller water loss in a stage apparatus in a vacuum environment or a stage apparatus in an environment purged of air (oxygen) with nitrogen, helium, or the like.

Sixth Embodiment

FIGS. 9A to 9D are views showing the sixth embodiment.

The fifth embodiment uses a polyurethane or thermoplastic fluororesin tube as a piping material. The sixth embodiment considers measures against electrostatic buildup on the surfaces of tubes. This embodiment is particularly effective when it is used in a low-humidity environment in a vacuum.

Figure 9A:
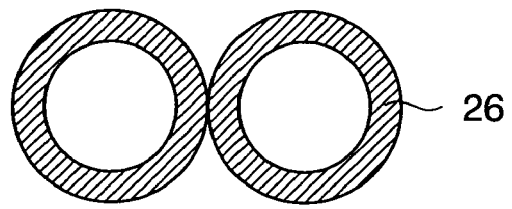
FIGS. 9A to 9D are views showing the cross sections of stage piping assemblies according to the sixth embodiment.

As shown in FIG. 9A, this embodiment is characterized by using conductive polyurethane or conductive thermoplastic fluororesin tubes 26 as piping tubes. Each of these tubes is formed by adding a conductive filler such as carbon powder to the base material of a polyurethane or thermoplastic fluororesin tube according to the first embodiment. Rendering the tubes conductive and grounding their surfaces to chassis ground make it possible to prevent electrostatic buildup.

Figure 9B:
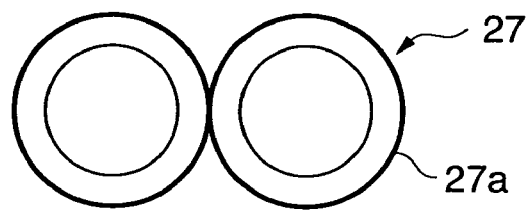

Alternatively, as shown in FIG. 9B, this embodiment is characterized by using conductive-material-deposited tubes 27 whose surfaces are conductive as piping tubes. Each conductive-material-deposited tube 27 can be manufactured by forming a conductive material deposition layer 27a on the surface of the piping tube by sputtering, or the like. Similar to the example of FIG. 9A, rendering the tubes conductive and grounding their surfaces to chassis ground make it possible to prevent electrostatic buildup.

Figure 9C:
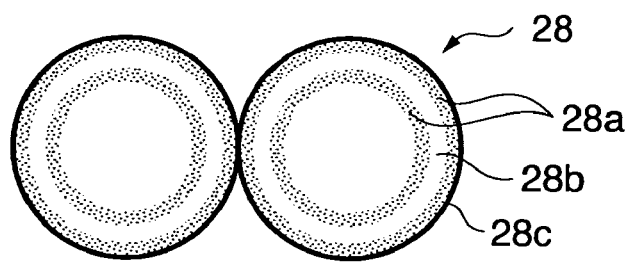

Alternatively, as shown in FIG. 9C, this embodiment is characterized by using, as piping tubes, multilayered polyurethane/thermoplastic fluororesin tubes 28 each having thermoplastic fluororesin tubes 28a with lower water absorption as the inner and outer surfaces of the tube and a polyurethane tube 28b as the intermediate layer of the tube. A conductive material deposition layer 28c is formed on the surface by sputtering, or the like. With this arrangement, a piping assembly with a smaller water loss, which can prevent electrostatic buildup, can be implemented in a stage apparatus in a vacuum environment or a stage apparatus in an environment purged of air (oxygen) with nitrogen, helium, or the like.

Figure 9D:
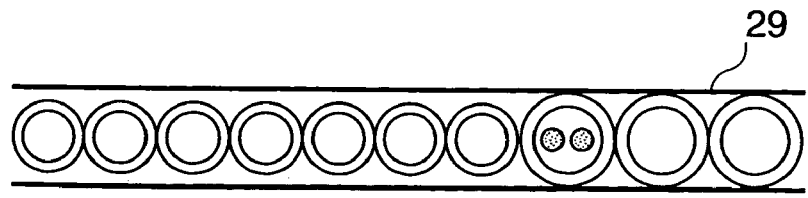

Alternatively, as shown in FIG. 9D, this embodiment is characterized by arranging conductive flexible sheets 29 adjacent to the upper and lower surfaces of integrally coupled piping tubes and grounding the conductive flexible sheets 29 to a stage chassis. This makes it possible to remove charges from the surfaces of the piping tubes.

The above description has explained an embodiment, which considers measures against electrostatic buildup on the surfaces of tubes.

Seventh Embodiment

Figure 10:
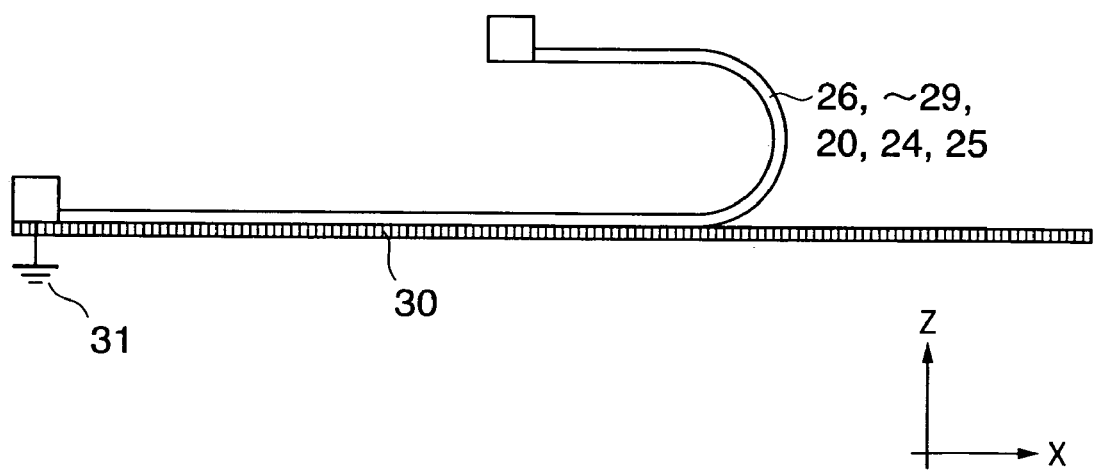
FIG. 10 is a view showing a piping rail 30 (conductive material) in which a chassis ground 31 is arranged within a range wherein antistatic piping tubes 26 to 29 flexibly move, according to the seventh embodiment.

FIG. 10 is a view showing the seventh embodiment.

The seventh embodiment is characterized by providing a piping rail 30 (conductive material) in which chassis ground 31, as shown in FIG. 10, is arranged within a range where the antistatic piping tubes 26 to 29, described in the sixth embodiment, flexibly move.

This piping rail makes it possible to ground the surfaces of the conductive piping tubes to the piping rail, i.e., directly to chassis ground.

In the piping tubes 20, 24, and 25 described in the first to fifth embodiments, which are not conductive, an antistatic effect can be expected.

Eighth Embodiment

Figure 11:
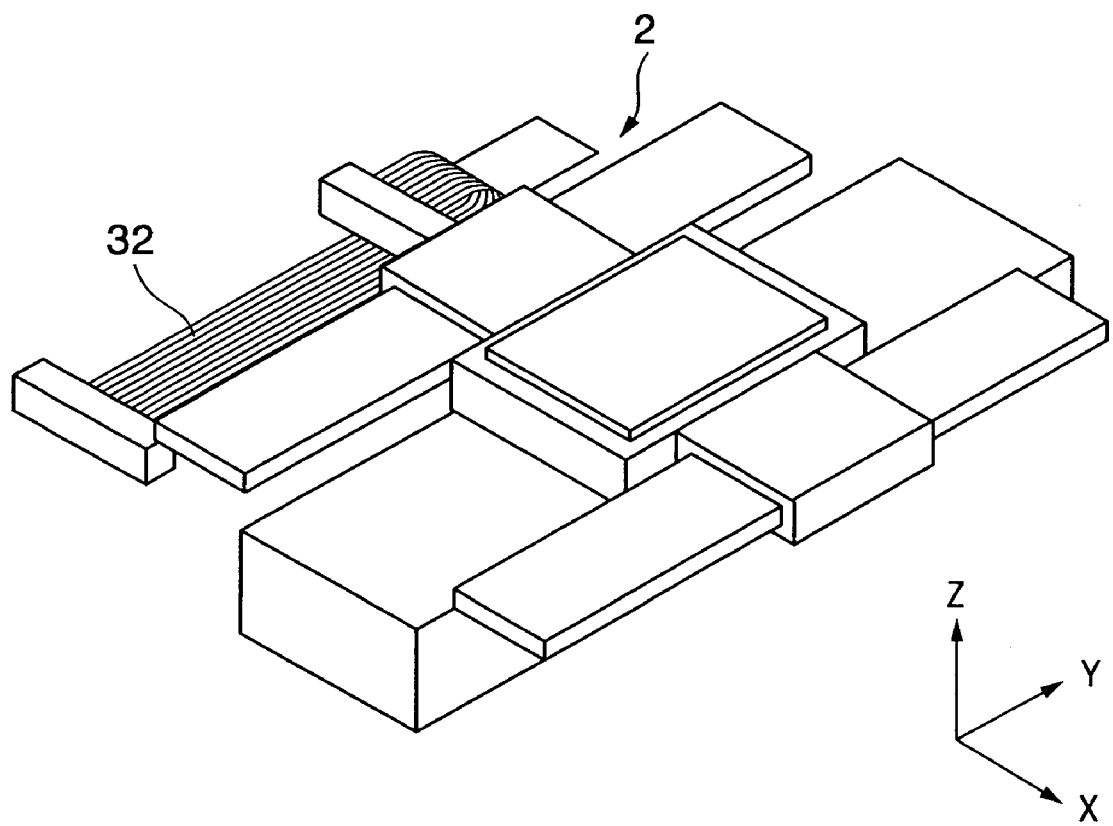
FIG. 11 is a view showing a Y piping assembly 32 in a reticle stage 2, according to the eighth embodiment.

FIG. 11 shows the eighth embodiment, i.e., a Y piping assembly 32 in a reticle stage 2.

Each of the first to seventh embodiments has described piping assemblies in a wafer stage. In the eighth embodiment, the Y piping assembly 32 performs scan movement in accordance with a movable unit of the reticle stage 2, which performs a reticle scan operation for a wafer at a predetermined reduction exposure magnification ratio in the reticle stage, on which a reticle serving as an exposure pattern master is mounted. The Y piping assembly 32 can have the same arrangement as those of the above-mentioned embodiments.

Ninth Embodiment

Figure 12A:
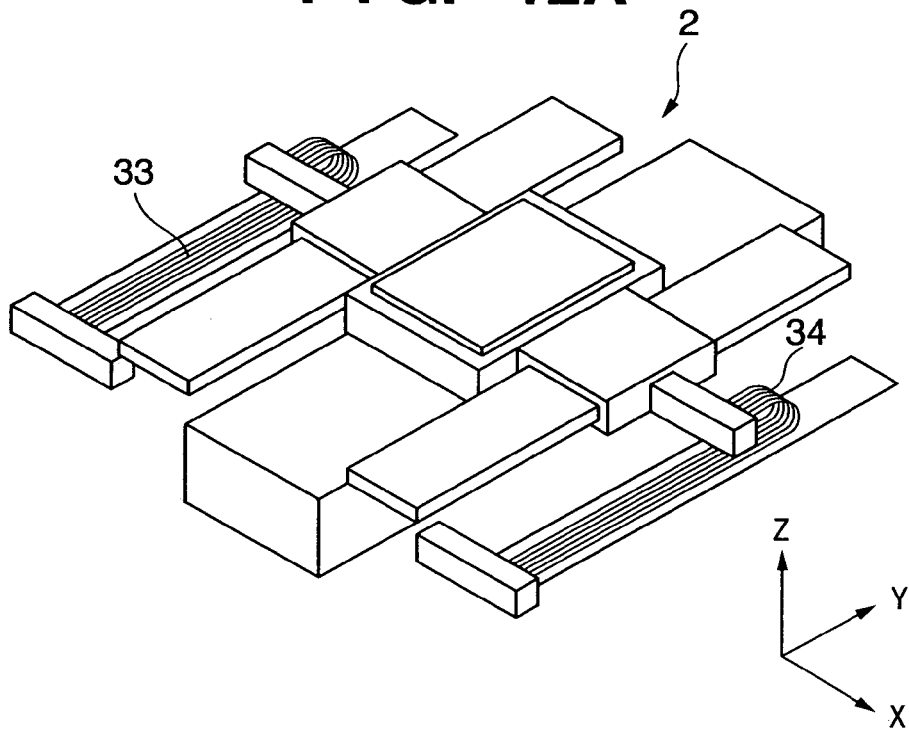
FIGS. 12A to 12C are views showing the states and cross sections, respectively, of Y piping assemblies arranged almost symmetrically with respect to the reticle stage 2, according to the eighth embodiment.
Figure 12B:
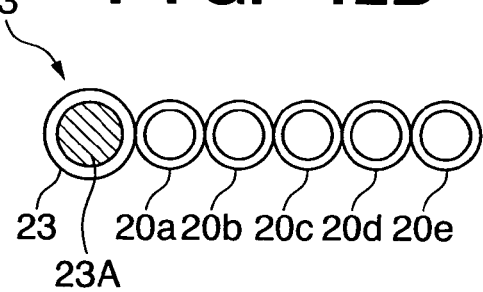
Figure 12C:
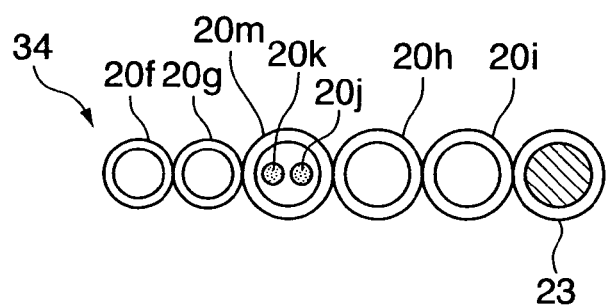

FIGS. 12A to 12C show the ninth embodiment. FIG. 12A shows a reticle stage, and FIGS. 12B and 12C show cross sections, respectively, of Y piping assemblies arranged on the reticle stage.

In the first to eighth embodiments, an integrated pipe array is arranged on one side of the moving direction of a movable unit of a stage apparatus. The ninth embodiment is characterized in that pipe arrays are arranged symmetrically with respect to the moving direction of the stage apparatus.

As shown in FIGS. 12A to 12C, a Y piping assembly 33 and Y piping assembly 34 (pipe arrays) are arranged almost symmetrically with respect to a moving direction of a reticle stage 2. With this arrangement, moving resistances from the integrated pipe arrays are symmetrically applied when the stage moves in the moving direction. This makes it possible to suppress generation of yawing in stage movement and to perform stable movement control.

In the Y piping assembly 33 on the left side of the reticle stage 2, one of vibration damping pipes 23 (gel with a large internal loss and a liquid are sealed inside the pipe) and pressure air pipes 20a to 20e are integrally arranged in this order, as shown in FIG. 12B.

In the Y piping assembly 34 on the right side of the reticle stage 2, the remaining vibration damping pipe 23 (gel with a large internal loss and a liquid are sealed inside the pipe), coolant pipes 20h and 20i, an electrical-cable-incorporated pipe 20m incorporating electrical cables 20j and 20k, and vacuum pipes 20f and 20g, are integrally arranged, in this order.

This symmetrical arrangement of the pipe arrays reduces assembly disturbance. At the same time, generating a moving load in the pipes symmetrically with respect to the movable units suppresses generation of yawing in movement. This can stabilize the alignment precision of the stage apparatus.

As has been described above, according to the present invention, separate connections from systems to a movable unit are integrated into a belt-like pipe array. This arrangement prevents any rub of the pipes of the respective systems against each other, any warp of the pipes at an indefinite position, and any warp of the pipes at a pipe coupling portion, when each stage movable unit moves. This makes it possible to reduce disturbance to the stage movable unit and dust from the pipes and to increase the stage control accuracy and alignment precision.

Also, the present invention is arranged such that movement of piping system connecting portions does not generate static electricity on the surface of piping members when a stage apparatus is used in a low-humidity environment in a vacuum. This arrangement prevents an electrostatic spark from generating at an indefinite position between the pipes or between components on the stage apparatus to damage the pipes, electrical cables, and the components on the stage. The reliability of the stage apparatus increases.

Note that the shapes and structures of the respective elements shown in the above-described embodiments are merely given as an example of implementation of the present invention, and the technical scope of the present invention is not limitedly interpreted with these shapes and structures. That is, the present invention can be implemented in various forms without departing from its spirit and its principal features.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus comprising:
projection means for projecting a pattern drawn on a surface of a master;
a stage apparatus which moves at least a substrate of the master and a substrate relative to said projection means; and
exposure means for repeatedly exposing the substrate to the pattern of the master,
wherein a plurality of pipes connected to movable units of said stage apparatus are joined to each other at partial outer surfaces of the pipes and constitute an integrated pipe array, and
wherein vibration damping pipes filled with a liquid or a damping member are arranged on an outer surface of the pipe array.

2. The apparatus according to claim 1, wherein electrical cables or signal line cables connected to the movable unit pass through hollow portions of some of the pipes serving as in the integrated pipe array.

3. The apparatus according to claim 1, wherein thermoplastic fluororesin or a multilayered member made of polyurethane resin and a thermoplastic fluororesin is used as piping material for the integrated pipe array.

4. The apparatus according to claim 1, wherein a resin made of a polymeric material to which a conductive material is added as a piping material for the integrated pipe array.

5. The apparatus according to claim 1, wherein a conductive material is deposited on the outer surface of the integrated pipe array.

6. The apparatus according to claim 5, wherein the outer surface of the integrate pipe array is grounded to a chassis ground of said stage apparatus.

7. The apparatus according to claim 6, wherein a conductive member is used as a material for a member which supports as a fixed unit or guides the integrated pipe array.

8. The apparatus according to claim 1, wherein sheet-like films made of a conductive material are arranged almost adjacent to the outer surface of the integrated pipe array.

9. The apparatus according to claim 8, wherein the outer surface of the integrate pipe array is grounded to a chassis ground of said stage apparatus.

10. The apparatus according to claim 9, wherein a conductive member is used as a material for a member which supports as a fixed unit or guides the integrated pipe array.

11. An exposure apparatus comprising:

projection means for projecting a pattern drawn on a surface of a master;

a stage apparatus which moves at least a substrate of the master and a substrate relative to said projection means; and exposure means for repeatedly exposing the substrate to the pattern of the master, wherein a plurality of pipes connected to movable units of said stage apparatus are joined to each other at partial outer surfaces of the pipes and constitute an integrated pipe array, and wherein a vibration damping pipe which encloses the integrated pipe array is provided, and a hollow portion between the integrated pipe array and the vibration damping pipe is filled with a liquid or damping member.

* * * * *